United States Patent
Chien et al.

(10) Patent No.: US 6,613,655 B2
(45) Date of Patent: Sep. 2, 2003

(54) METHOD OF FABRICATING SYSTEM ON CHIP DEVICE

(75) Inventors: Sun-Chieh Chien, Hsinchu (TW); Chien-Li Kuo, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 60 days.

(21) Appl. No.: 10/050,258

(22) Filed: Jan. 16, 2002

(65) Prior Publication Data

US 2003/0100171 A1 May 29, 2003

(30) Foreign Application Priority Data

Nov. 26, 2001 (TW) ........................ 90129155 A

(51) Int. Cl.$^7$ ............................................. H01L 21/22
(52) U.S. Cl. ...................... 438/551; 438/552; 438/558; 438/671; 438/587
(58) Field of Search ................................ 438/551, 552, 438/555, 671, 717, 736, 586, 587

(56) References Cited

U.S. PATENT DOCUMENTS 6,331,462 B1 * 12/2001 Kasaoka et al. ............ 438/253

* cited by examiner

Primary Examiner—D Le
(74) Attorney, Agent, or Firm—Charles C. H. Wu; Wu & Cheung, LLP

(57) ABSTRACT

A method of fabricating a system on a chip device. On a substrate having a memory cell region and a peripheral circuit region a gate oxide layer and a polysilicon layer are formed. The peripheral circuit region can further be divided into a logic device region and a hybrid circuit region. A dielectric layer is formed on the peripheral circuit region. A cap layer and a conductive layer are further formed on the polysilicon layer in the memory cell region and on the dielectric layer in the peripheral circuit region. Using the dielectric layer in the peripheral circuit region and the gate oxide layer in the memory cell region as etch stop, the cap layer and the conductive layer in the peripheral circuit region, and the cap layer, the conductive layer and the polysilicon layer are patterned. As a result, at least a gate and a top electrode are formed in the memory cell region and the hybrid circuit region, respectively. Using the gate oxide layer in the peripheral circuit region as an etch stop, the dielectric layer and the conductive layer in the peripheral circuit region are patterned to form a gate in the logic circuit region and the hybrid circuit region, respectively.

20 Claims, 3 Drawing Sheets

METHOD OF FABRICATING SYSTEM ON CHIP DEVICE

CROSS-REFERENCE TO RELATED APPLICATION

This application claims the priority benefit of Taiwan application serial No. 90129155, filed Nov. 26, 2001.

BACKGROUND OF THE INVENTION

1. Field of the Invention

The invention relates in general to a method of fabricating an integrated circuit device. More particularly, this invention relates to a method of fabricating a system on a chip device.

2. Description of the Related Art

Due to the great demand for forming light, thin, short, small and multifunctional devices, the fabrication process has been developed from 0.6 micron to 0.35 micron, and to the current 0.18 micron. As the dimension of the device shrinks, the area of the wafer enlarges and the product yield enhances, to fabricate thousands of logic gate circuits on a single chip have been achieved in practical application.

In a system on a chip device, the conventional chip set system is replaced by implementing all the functions of the chip sets into a single chip. However, although the current fabrication process has overcome the limitations of the logic gate number and the product yield, several conventional fabrication processes are now inapplicable.

SUMMARY OF THE INVENTION

The invention provides a method of fabricating a system on a chip. The embedded logic, hybrid circuit and memory can be integrated in the same chip. In addition, the invention provides a method of fabricating a system on a chip with simplified process using less photomasks.

In the method provided by the invention, on a substrate having a memory cell region and a peripheral circuit region a gate oxide layer, a polysilicon layer and a dielectric layer are formed. The dielectric layer over the memory cell region is removed. A conductive layer and a cap layer are formed over the substrate. A photoresist layer is formed on the cap layer to cover a region in the memory cell region predetermined for forming a gate and a region in the hybrid circuit region of the peripheral circuit region predetermined for forming a top electrode of a capacitor. Using the photoresist layer as a mask and the dielectric layer and the gate oxide layer as stop layers, the cap layer and the conductive layer over the hybrid circuit region uncovered by the photoresist layer are removed. Meanwhile, the cap layer in the memory cell region uncovered with the photoresist layer and the underlying conductive layer and polysilicon layer are also removed. Consequently, the top electrode of the capacitor and the gates of the memory device are formed. Another photoresist layer is further formed to cover the whole memory cell region, a region in a logic device region in the peripheral circuit region predetermined for forming a gate, and a region in the hybrid circuit region predetermined for forming a bottom electrode. The exposed dielectric layer and the underlying polysilicon layer are etched until the gate oxide layer is exposed. The photoresist layer is then removed. As a result, gates are formed in the memory cell region, the logic circuit region and a capacitor is formed in the hybrid circuit region.

In addition, a first well, a second well and a third well are formed in the memory cell region, the logic device region and the hybrid circuit region, respectively. The doping concentration of the first well is lower than those of the second and the third wells. The conductive layer comprises a metal silicide layer or a polycide layer. The cap layer is made of silicon nitride or silicon oxy-nitride.

In the above method, the gate in the memory cell region and the top electrode in the hybrid circuit region are formed in the same step, and the gate in the logic device region and the bottom electrode are also formed in the same step. Therefore, the total photomask for forming such device is reduced, so that the fabrication process steps are reduced, and the fabrication cost is lowered.

Both the foregoing general description and the following detailed description are exemplary and explanatory only and are not restrictive of the invention as claimed.

DESCRIPTION OF THE PREFERRED EMBODIMENTS

Figure 1A:
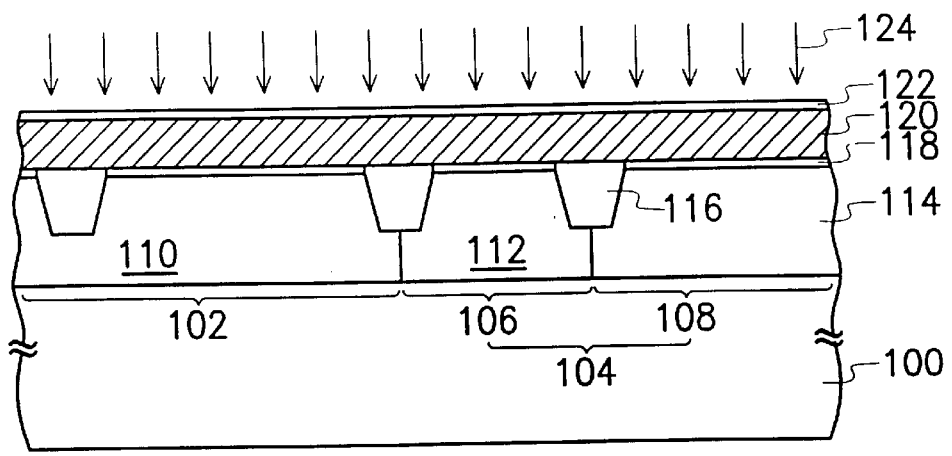
FIGS. 1A–1E illustrate cross sectional views of a system on chip device in different fabrication processes.

In FIG. 1A, a substrate 100 is provided. The substrate 100 comprises a memory cell region 102 and a peripheral circuit region 104 which further comprises a logic device region 106 and a hybrid circuit region 108. Wells 110, 112 and 114 are formed in the memory cell region 102, the logic device region 106 and the hybrid circuit region 108, respectively. When the well region 112 is an N-type well, the well 114 is a P-type well. The doping concentration of the well 112 is about $1\times10^{16}$ to $1\times10^{17}/cm^3$, and the doping concentration of the well 110 is lower than those of the wells 112 and 114. An isolation region 116 is formed between wells 110 and 112, the wells 112 and 114, and other regions over the substrate 100. The isolation structures 116 include a shallow trench isolation (STI). The method for forming the isolation structures 116 includes forming a trench in the substrate, followed by filling the trench with an isolation layer.

Agate oxide layer 118, a polysilicon layer 120 and a dielectric layer 122 are formed on the wells 110, 112 and 114 and the isolation structures 116 over the substrate 100. The method for forming the gate oxide layer 118 includes thermal oxidation. The method for forming the polysilicon layer 120 includes low pressure chemical vapor deposition (LPCVD). Preferably, the polysilicon layer 120 can be doped with dopant to increase the conductivity thereof. The polysilicon layer 120 can be doped in situ during formation. Or alternatively, after forming the dielectric layer 122, the polysilicon layer 120 can be doped with an ion implantation step. The material of the dielectric layer includes oxide/nitride/oxide (ONO) that has an etching rate significant to the etching rate of the polysilicon layer.

Figure 1B:
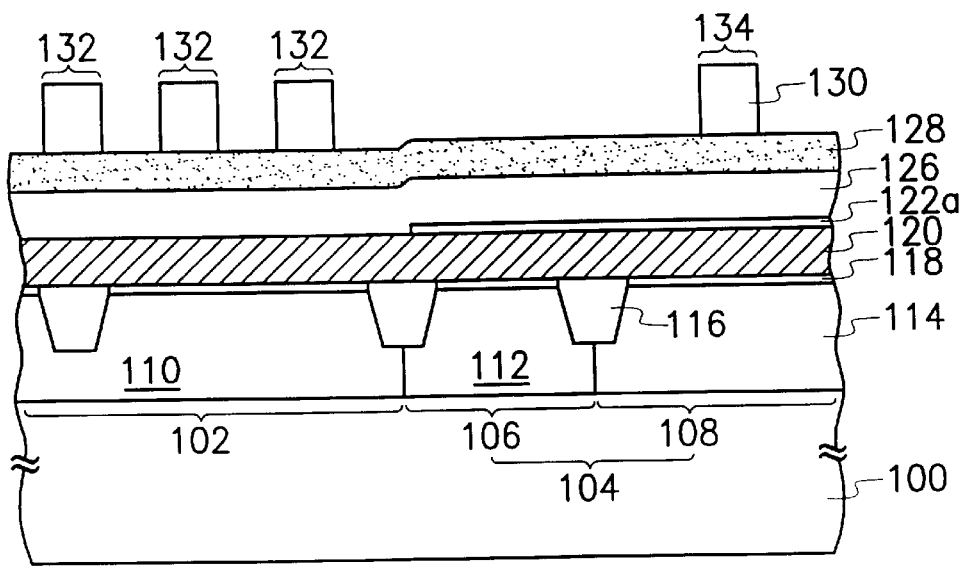

In FIG. 1B, using a photolithography and etching process, the dielectric layer 122 over the memory cell region 102 is removed. The remaining dielectric layer covering the peripheral circuit region 104 only is denoted as 122a. A conductive layer 126 and a cap layer 128 is then formed on the polysilicon layer 120 over the memory cell region 102 and the remaining dielectric layer 122a over the peripheral circuit region 104 over the substrate 100. The etching rates of the conductive layer 126 and the cap layer 128 are also different from the etching rate of the dielectric layer 122a. The material for forming the conductive liver 126 includes metal silicide or polysilicide such as tungsten silicide (SiW). The method for forming the conductive layer 126 includes chemical vapor deposition (CVD). When a polycide layer is formed as the conductive layer 126, the forming method of this polycide layer comprises forming a polysilicon layer followed by a step of silicidation. The polysilicon layer is preferably doped in situ or by an ion implantation step after the cap layer 128 is formed. The material for forming the cap layer 128 includes silicon nitride (SiN) or silicon oxy-nitride (SiON) by low pressure chemical vapor deposition (LPCVD).

A patterned photoresist layer 130 is formed on the cap layer 128 to cover regions 132 in the memory cell regions 102 predetermined for forming gates and a region 134 in the hybrid circuit region 108 predetermined for forming a top electrode of a capacitor.

Figure 1C:
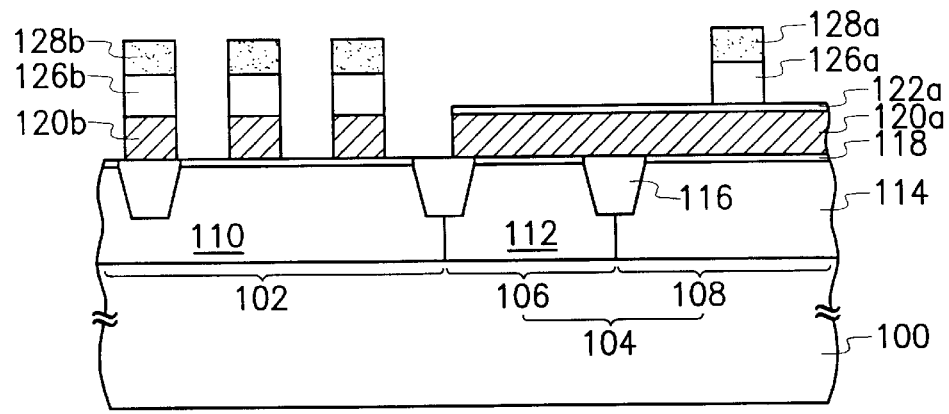

In FIG. 1C, using the photoresist layer 130 as a mask and the gate oxide layer 118 and the remaining dielectric layer 122a as etch stops, the cap layer 128, the conductive layer 126 and the polysilicon layer 120 in the memory cell region 102 are etched. The polysilicon layer 120b and the conductive layer 126b in the memory cell region 102 are thus remained as a gate conductive layer, and the polysilicon layer 126a in the hybrid circuit region 108 is remained as a top electrode of the capacitor. The photoresist layer 130 is then removed to expose the remaining cap layer 128a and 128b in the memory cell region 102 and the peripheral circuit region 104.

Figure 1D:
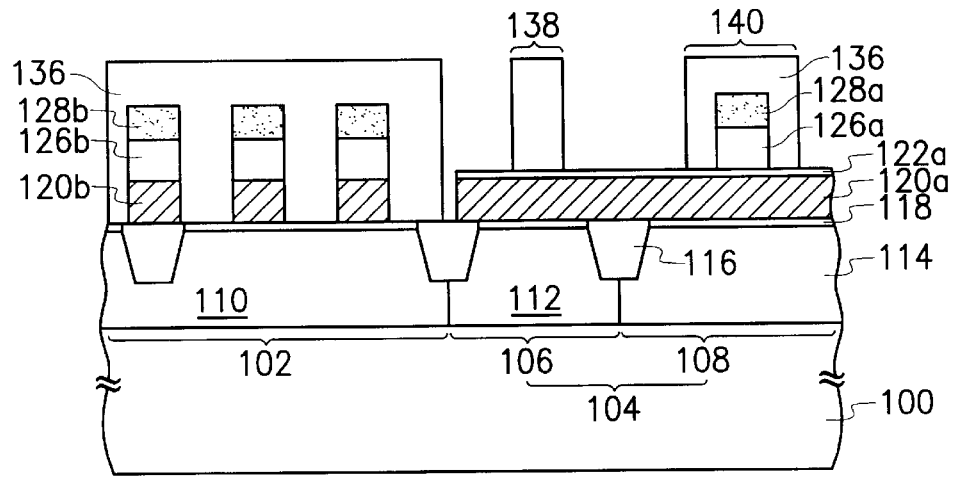

In FIG. 1D, another photoresist layer 136 is further formed to cover the memory cell region 102 completely a region 138 of the dielectric layer 122a in the logic device region 106 predetermined for forming a region 140 in the hybrid circuit region 108 predetermined for forming a bottom electrode. Preferably, the coverage of the region 140 includes the complete top electrode 126a and the remaining cap layer 128a.

Figure 1E:
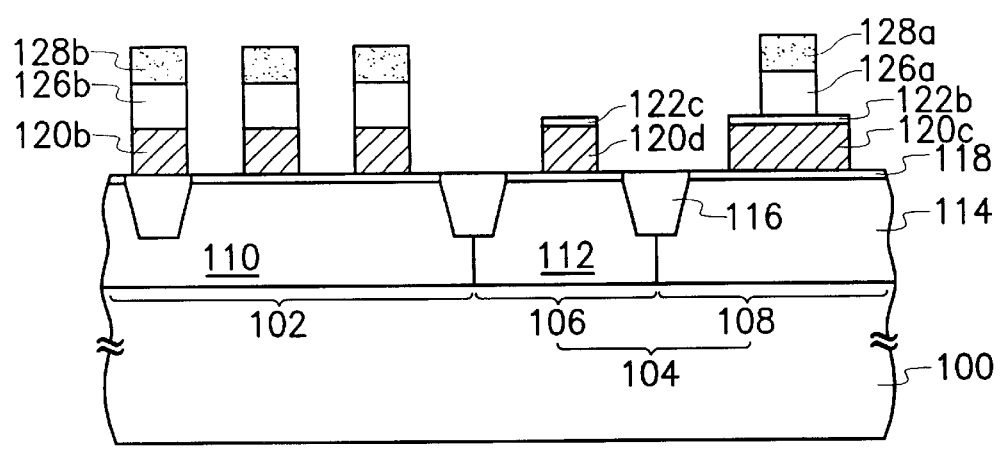

In FIG. 1E, using the photoresist layer 136 is a mask, the exposed remaining dielectric layer 122a and the underlying polysilicon label 120a in the peripheral circuit region 104 removed until the gate oxide layer 118 is exposed. The photoresist layer 136 is removed. As a result, a gate comprising the remaining dielectric layer 122c and the remaining polysilicon layer 120d in the logic device region 106 is formed. A capacitor comprising a bottom electrode of the remaining polysilicon layer 120c, the remaining dielectric layer 122b and the top electrode 126a is also formed in the hybrid circuit region 108. (the description do not mention item 128a in FIG. 1E)

In the invention, after forming a polysilicon layer, a dielectric layer is remained in the peripheral circuit region only. A conductive layer and a cap layer are further formed. Due to the different etching rates between the dielectric layer, the conductive layer, the cap layer and the polysilicon layer, the dielectric layer can be used as an etch stop of the polysilicon layer in the peripheral circuit region while patterning the polysilicon layer in the memory cell region. Therefore, the polysilicon layer (predetermined ?)for forming the gate in the logic device region and the bottom electrode in the hybrid circuit region can be protected from being damaged. In this manner, the gates in the memory cell region and the top electrode of the capacitor in the hybrid circuit region are formed in the same photolithography step using only one photomask. In addition, the bottom electrode of the capacitor in the hybrid circuit region and the gate in the logic device region are also formed in the same photolithography step without introducing an additional photomask.

Therefore, the invention provides a simplified fabrication process that reduce the number of the photomasks, so that the fabrication cost is reduced.

It is appreciated that the above method is not limited for forming a system on a chip. The method can also applied for forming various semiconductor devices in integrated circuits.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a system on a chip, the method comprising:

providing a substrate, the substrate comprising a memory cell region and a peripheral circuit region which further comprising a logic device region and a hybrid circuit region;

forming a gate oxide layer and a polysilicon layer covering both the memory cell region and the peripheral circuit region, and a dielectric layer covering the peripheral region only;

forming a conductive layer and a cap layer on the polysilicon layer in the memory cell region and on the dielectric layer in the peripheral circuit region;

forming a first photoresist layer covering at least a region in the memory cell region predetermined for forming a gate and at least a region in the hybrid circuit region predetermined for forming a top electrode of a capacitor;

using the first photoresist layer as a mask to etch the cap layer, the conductive layer and the polysilicon layer in the memory cell region, and the cap layer and the conductive layer in the peripheral circuit region until the gate oxide layer in the memory cell region and the dielectric layer in peripheral circuit region are exposed;

removing the first photoresist layer;

forming a second photoresist layer to completely cover the memory region, a region in the logic device region predetermined for forming a gate and a region in the hybrid circuit region predetermined for forming a bottom electrode; and using the second photoresist layer as a mask to etch the dielectric and the polysilicon layer in the peripheral circuit region until the gate oxide layer is exposed.

2. The method according to claim 1, comprising further the steps of forming a first well in the memory cell region, a second well in the logic device region and a third well in the hybrid circuit region.

3. The method according to claim 2, wherein the second and third wells have a doping concentration higher than that of the first well.

4. The method according to claim 1, comprising further a first well in the memory cell region, a second well in the logic device region and a third well in the hybrid circuit region, wherein the first, second and third wells are isolated from each other by an isolation structure.

5. The method according to claim 1, wherein the step of forming the dielectric layer comprises a step of forming the dielectric layer with an etching rate different from those of the cap layer, the conductive layer and the polysilicon layer.

6. The method according to claim 1, wherein the step of forming the dielectric layer comprises a step of forming an oxide/nitride/oxide layer.

7. The method according to claim 1, wherein the step of forming the conductive layer comprises a step of forming a metal silicide layer.

8. The method according to claim 1, wherein the step of forming the conductive layer comprises a step of forming a polycide layer.

9. The method according to claim 1, wherein the step of forming the cap layer comprises a step of forming a silicon oxy-nitride layer.

10. The method according to claim 1, wherein the step of forming the cap layer comprises a step of forming a silicon nitride layer.

11. A method of fabricating a system on a chip the method comprising:

providing a substrate, the substrate comprising a memory cell region and a peripheral circuit region which further comprising a logic device region and a hybrid circuit region;

forming a gate oxide layer and a polysilicon layer covering both the memory cell region and the peripheral circuit region, and a dielectric layer covering the peripheral region only;

forming a conductive layer and a cap layer on the polysilicon layer in the memory cell region and dielectric layer in the peripheral circuit region;

simultaneously patterning the cap layer, the conductive layer and the polysilcon layer in the memory cell region, and the cap layer and the conductive layer in the peripheral circuit region to form at least a gate in the memory cell region and a top electrode in the hybrid circuit region; and patterning the dielectric layer and the polysilicon layer in the peripheral circuit region to form a gate in the logic device region and a bottom electrode in the hybrid circuit region simultaneously.

12. The method according to claim 11, comprising further the step of forming a first well in the memory cell region, a second well in the logic device region and a third well in the hybrid circuit region.

13. The method according to claim 12, wherein the second and third wells have a doping concentration higher than that of the first well.

14. The method according to claim 11, comprising further a first well in the memory cell region, a second well in the logic device region and a third well in the hybrid circuit region, wherein the first, second and third wells are isolated from each other by an isolation structure.

15. The method according to claim 11, wherein the step of forming the dielectric layer comprises a step of forming the dielectric layer with an etching rate different from those of the cap layer, the conductive layer and the polysilicon layer.

16. The method according to claim 11, wherein the step of forming the dielectric layer comprises a step of forming an oxide/nitride/oxide layer.

17. The method according to claim 11, wherein the step of forming the conductive layer comprises a step of forming a metal silicide layer.

18. The method according to claim 11, wherein the step of forming the conductive layer comprises a step of forming a polycide layer.

19. The method according to claim 11, wherein the step of forming the cap layer comprises a step of forming a silicon oxy-nitride layer.

20. The method according to claim 11, wherein the step of forming the cap layer comprises a step of forming a silicon nitride layer.

* * * * *